United States Patent
Na et al.

(10) Patent No.: US 11,398,326 B2
(45) Date of Patent: Jul. 26, 2022

(54) SUPERCONDUCTIVE CABLE

(71) Applicant: LS CABLE & SYSTEM LTD., Anyang-si (KR)

(72) Inventors: Jin Bae Na, Seoul (KR); Han Joong Kim, Seoul (KR); Young Woong Kim, Suwon-si (KR); Chang Yeol Choi, Ansan-si (KR); Heo Gyung Sung, Suwon-si (KR); Seok Ju Lee, Suwon-si (KR)

(73) Assignee: LS CABLE & SYSTEM LTD., Anyang-si (KR)

( * ) Notice: Subject to any disclaimer, the term of this patent is extended or adjusted under 35 U.S.C. 154(b) by 287 days.

(21) Appl. No.: 16/810,346

(22) Filed: Mar. 5, 2020

(65) Prior Publication Data

US 2020/0203043 A1 Jun. 25, 2020

Related U.S. Application Data

(62) Division of application No. 15/526,033, filed as application No. PCT/KR2014/010807 on Nov. 11, 2014, now Pat. No. 10,629,333.

(51) Int. Cl.
*H01B 12/14* (2006.01)
*H01B 12/06* (2006.01)
(Continued)

(52) U.S. Cl.
CPC .............. *H01B 12/14* (2013.01); *H01B 12/06* (2013.01); *H01B 12/16* (2013.01); *H01L 39/12* (2013.01); *Y02E 40/60* (2013.01)

(58) Field of Classification Search
CPC .......... H01B 12/06; H01B 12/16; H01L 39/12
See application file for complete search history.

(56) References Cited

U.S. PATENT DOCUMENTS

2002/0170733 A1* 11/2002 Rasmussen ............ H01B 12/14
174/68.1
2008/0194411 A1 8/2008 Folts et al.
(Continued)

FOREIGN PATENT DOCUMENTS

JP S49-115676 U 10/1974
JP 2008-047519 2/2008
(Continued)

OTHER PUBLICATIONS

Machine translation of JP 2012-256508 (Year: 2012).*
(Continued)

*Primary Examiner* — Paul A Wartalowicz
(74) *Attorney, Agent, or Firm* — K&L Gates LLP

(57) ABSTRACT

A superconductive cable including: a former; one or more superconductive conductor layers provided outside the former; an insulating layer configured to surround the superconductive conductor layers; and one or more superconductive shield layers provided on an exterior of the insulating layer. The superconductive conductor layers and the superconductive shield layers are formed of superconductive wire rods, and each superconductive wire rod includes a metal substrate layer and a plurality of superconducting layers deposited on the metal substrate layer using a superconductive material. In the superconductive wire rods of an outermost superconductive conductor layer among the superconductive conductor layers and an innermost superconductive shield layer among the superconductive shield layers, each of the metal substrate layers and the superconducting layers are disposed in opposite directions.

5 Claims, 6 Drawing Sheets

(51) Int. Cl.
    *H01B 12/16*     (2006.01)
    *H01L 39/12*     (2006.01)

(56) References Cited

U.S. PATENT DOCUMENTS

| | | |
|---|---|---|
| 2011/0203829 A1 | 8/2011 | Jang et al. |
| 2012/0046541 A1 | 2/2012 | Wheaton |
| 2014/0038829 A1* | 2/2014 | Hanafusa ............... H01B 12/02 505/473 |

FOREIGN PATENT DOCUMENTS

| | | |
|---|---|---|
| JP | 2010-192116 A | 9/2010 |
| JP | 2012-256508 | 12/2012 |
| JP | 2012-256508 A | 12/2012 |
| JP | 5192741 B2 | 5/2013 |
| JP | 5385746 B2 | 1/2014 |
| KR | 10-2014-0115169 A | 9/2014 |
| KR | 10-2014-0050515 A | 5/2015 |

OTHER PUBLICATIONS

Machine translation of JP 2008-047519 (Year: 2008).*
German Office Action for related German Application No. 11 2014 007 158.7; dated Sep. 11, 2020; (13 pages).
Chinese Office Action for related Chinese Application No. 201480083325.9; dated Aug. 10, 2018; (6 pages).
International Search Report for PCT/KR2014/010807; dated Aug. 12, 2015 from the Korean Intellectual Property Office.
Japanese Office Action for related JP Application No. 2017-523228 dated Nov. 22, 2017 from Japan Patent Office.

* cited by examiner

SUPERCONDUCTIVE CABLE

CROSS-REFERENCE TO RELATED APPLICATIONS

The present application is a divisional of and claims priority to and the benefit of U.S. patent application Ser. No. 15/526,033 filed on May 11, 2017 which is a U.S. National Stage of International Application No. PCT/KR2014/010807, filed Nov. 11, 2014 under 35 U.S.C § 371, the disclosures of which are incorporated herein by reference.

FIELD OF THE INVENTION

The present invention relates to a superconductive cable. More particularly, the present invention relates to a superconductive cable in which a superconductive conductor layer and a superconductive shield layer are formed of superconductive wire rods having a (Ni—W based) magnetic metal substrate, the superconductive cable is capable of minimizing alternating current (AC) loss caused during AC power transmission.

BACKGROUND OF THE INVENTION

A superconductive wire rod has great electric-power transmission capability even at a low voltage because the electrical resistance thereof converges close to zero at a given temperature.

A superconductive cable having such a superconductive wire rod adopts a cooling method using a refrigerant such as, for example, nitrogen and/or a thermal insulation method of forming a vacuum layer, in order to create and maintain a cryogenic environment.

Such a superconductive cable may generally include a superconductive conductor layer formed of a superconductive wire rod for electric power transmission and a superconductive shield layer for shielding, for example, electromagnetism induced by the superconductive conductor layer. The superconductive shield layer is also formed of a high-cost superconductive wire rod, like the superconductive conductor layer.

That is, electromagnetic waves, induced by electric power transmitted through the superconductive conductor layer, may be shielded by the superconductive shield layer.

A first-generation BSCCO-based superconductive wire rod developed to date may be manufactured via a relatively simple mechanical processing method. However, such a BSCCO-based (Bi-2233 or Bi-2212) superconductive wire rod has a limitation in that a critical current density (Jc) may not be increased to one hundred thousand A/cm2 or more at a temperature of 77K due to the crystal orientation thereof, and it is difficult to achieve a lower production cost for a given performance thereof because the price of Ag, which is the sheath material of the wire rod, is high. Therefore, recently, the first-generation superconductive wire rod has not been widely manufactured or used.

Meanwhile, a second-generation superconductive wire rod includes multiple oxide layers deposited on a metal substrate, and thus is called a coated conductor (hereinafter referred to as "CC").

A second-generation YBCO- or REBCO-based superconductive wire rod exhibits high critical current in a magnetic field and a critical current density that is dozens of times higher than the first-generation BSCCO-based wire rod. Therefore, it has been focused on since the early 1990s as a next-generation superconductive wire rod that may substitute for the first-generation high-temperature superconductive wire rod, and various manufacturing processes thereof have actively been developed.

Such a second-generation superconductive wire rod may generally include several thin oxide layers and protective layers deposited on a metal substrate.

Since the flow of supercurrent in the second-generation superconductive wire rod is limited at the grain boundary, in order to ensure the flow of a great quantity of supercurrent, it is important to improve crystal orientation by biaxially aligning crystal grains of the superconductive wire rod during the processing thereof. The second-generation superconductive wire rod is mainly formed by depositing a YBCO or REBCO (RE=Sm, Gd, Nd, Dy, Ho) material, and the superconductive characteristics of the second-generation superconductive wire rod greatly depend on, for example, the composition, density, and crystal orientation of a superconducting layer included in the produced superconductive wire rod.

A metal substrate provided in the second-generation superconductive wire rod is formed using any of different materials according to the deposition method of a buffer layer. A Hastelloy (an alloy such as SUS) substrate or a Ni—W alloy substrate in which metal crystals are bi-axially oriented in advance via rolling and recrystallization heat treatment (Rolling Assisted Biaxially Textured Substrate (RABiTS)) is representatively used.

When, for example, the Ni—W alloy substrate formed of a magnetic substance is used as the metal substrate of the second-generation superconductive wire rod, alternating current (AC) loss may occur during the transmission of AC power by a superconductive cable.

A superconductive cable using a superconductive wire rod may generally include a superconductive conductor layer formed of a superconductive wire rod for electric-power transmission and a superconductive shield layer for shielding, for example, electromagnetism induced by the superconductive conductor layer.

Recently, the superconductive cable may often be configured such that each of the superconductive conductor layer and the superconductive shield layer is formed of superconductive wire rods in multiple layers, in order to increase electric-power transmission capability.

When each of the superconductive conductor layer and the superconductive shield layer is formed of the superconductive wire rods in multiple layers, AC loss may be further worsened according to the direction or orientation of a metal substrate and a superconducting layer of the superconductive wire rod in each layer.

With regard to the AC loss of the superconductive wire rod, although Japanese Patent Laid-Open Publication No. JP 2012-256508 discloses a technique of minimizing AC loss by reducing the width of a superconductive wire rod of a superconductive conductor layer, no realization or suggestion for a technical solution related to the direction or orientation of the superconductive wire rod is presented in a concrete way. Japanese Patent Registration No. JP 5192741 discloses a technical object and a technical solution related to AC loss, but is very different from the present invention as to the technical solution thereof, and the effect thereof is also questionable. In addition, Japanese Patent Registration No. JP 5385746 discloses the structure of layers of a superconductive wire rod constituting a superconductive cable, but provides no realization or suggestion for a technical solution to achieve a technical object of the present invention.

BRIEF SUMMARY OF THE INVENTION

It is an object of the present invention to provide a superconductive cable, which may minimize alternating current (AC) loss that may occur during AC power transmission by controlling the orientation of a metal substrate layer and a superconducting layer of each of superconductive wire rods, which are formed in multiple layers to constitute a superconductive conductor layer and a superconductive shield layer of the superconductive cable.

To achieve the above-described object, in accordance with one aspect of the present invention, to accomplish the above and other objects, there is provided a superconductive cable including a core unit including a former, one or more superconductive conductor layers each having a plurality of superconductive wire rods arranged parallel to each other in a longitudinal direction of the former so as to surround an exterior of the former, an insulating layer configured to surround the superconductive conductor layers, and one or more superconductive shield layers each having a plurality of superconductive wire rods arranged parallel to each other in the longitudinal direction of the former so as to surround an exterior of the insulating layer, a cooling unit provided outside the core unit, the cooling unit having a circulation flow path of a liquid-phase refrigerant for cooling the core unit, a thermal insulation unit provided outside the cooling unit, the thermal insulation unit being configured by winding a thermal insulation material multiple times, and a vacuum unit provided outside the thermal insulation unit, the vacuum unit having a plurality of spacers spaced apart from one another, wherein each of the superconductive wire rods of the superconductive conductor layers and the superconductive shield layers includes a metal substrate layer and a plurality of superconducting layers deposited on the metal substrate layer using a superconductive material, and wherein, in each superconductive wire rod of an outermost superconductive conductor layer among the superconductive conductor layers, the metal substrate layer is disposed toward a center of the superconductive cable and the superconducting layers are disposed in a radial direction of the superconductive cable.

In this case, the superconductive conductor layers may be configured in multiple layers, and in the superconductive wire rods of the superconductive conductor layers, the metal substrate layers may be disposed toward the center of the superconductive cable and the superconducting layers may be disposed in the radial direction of the superconductive cable.

In addition, in each superconductive wire rod of an innermost superconductive shield layer among the superconductive shield layers, the superconducting layers may be disposed toward the center of the superconductive cable and the metal substrate layer may be disposed in the radial direction of the superconductive cable.

Here, the superconductive shield layers may be configured in multiple layers, and in the superconductive wire rods of the superconductive shield layers, all of the superconducting layers may be disposed toward the center of the superconductive cable and all of the metal substrate layers may be disposed in the radial direction of the superconductive cable.

In addition, the superconductive conductor layers may be configured in four layers, and the superconductive shield layers may be configured in two layers.

In addition, the superconductive wire rods of the superconductive conductor layers and the superconductive shield layers may be second-generation superconductive wire rods including a metal substrate layer formed of a nickel alloy material.

In accordance with another aspect of the present invention, there is provided a superconductive cable including a former, one or more superconductive conductor layers provided outside the former, an insulating layer configured to surround the superconductive conductor layers, and one or more superconductive shield layers provided on an exterior of the insulating layer, wherein the superconductive conductor layers and the superconductive shield layers are formed of superconductive wire rods, and each superconductive wire rod includes a metal substrate layer and a plurality of superconducting layers deposited on the metal substrate layer using a superconductive material, and wherein, in the superconductive wire rods of an outermost superconductive conductor layer among the superconductive conductor layers and an innermost superconductive shield layer among the superconductive shield layers, each of the metal substrate layers and the superconducting layers are disposed in opposite directions.

In addition, the superconductive conductor layers may be configured in multiple layers, and in the superconductive wire rods of the superconductive conductor layers, all of the superconducting layers may be disposed in a radial direction of the superconductive cable and the metal substrate layers may be disposed toward a center of the superconductive cable.

In this case, the superconductive shield layers may be configured in multiple layers, and in the superconductive wire rods of the superconductive shield layers, all of the superconducting layers may be disposed toward a center of the superconductive cable and all of the metal substrate layers may be disposed in a radial direction of the superconductive cable.

In accordance with a further aspect of the present invention, there is provided a superconductive cable including a core unit including a former, one or more superconductive conductor layers configured to surround an exterior of the former, an insulating layer configured to surround the superconductive conductor layers, and one or more superconductive shield layers configured to surround an exterior of the insulating layer, wherein the superconductive conductor layers and the superconductive shield layers are formed of superconductive wire rods, and each superconductive wire rod includes a metal substrate layer and a plurality of superconducting layers deposited on the metal substrate layer using a superconductive material, and wherein, in the superconductive wire rod of an outermost superconductive conductor layer among the superconductive conductor layers, the metal substrate layer is disposed toward a center of the superconductive cable and the superconducting layers are disposed in a radial direction of the superconductive cable, and in the superconductive wire rod of an innermost superconductive shield layer among the superconductive shield layers, the superconducting layers are disposed toward the center of the superconductive cable, and the metal substrate layer is disposed in the radial direction of the superconductive cable.

Here, the superconductive conductor layers and the superconductive shield layers may be configured in multiple layers, in the superconductive wire rods of the superconductive conductor layers, all of the superconducting layers may be disposed in the radial direction of the superconductive cable and the metal substrate layers may be disposed toward the center of the superconductive cable, and in the superconductive wire rods of the superconductive shield layers, all of the superconducting layers may be disposed toward the center of the superconductive cable and all of the metal substrate layers may be disposed in the radial direction of the superconductive cable.

In addition, the superconductive wire rods of the superconductive conductor layers and the superconductive shield layers may be second-generation superconductive wire rods including a metal substrate layer formed of a nickel alloy material.

With a superconductive cable according to the present invention, alternating current (AC) loss that occurs upon AC power transmission may be minimized by optimizing the direction or orientation of superconductive wire rods, which have a (Ni—W based) magnetic metal substrate and constitutes a superconductive conductor layer and a superconductive shield layer.

In addition, with the superconductive cable according to the present invention, it is possible to minimize deterioration in critical current depending on variation in the magnetic field of the superconductive wire rods that constitute the superconductive conductor layer and the superconductive shield layer, which may result in improved stability of an electric power system including the superconductive cable.

DETAILED DESCRIPTION OF THE INVENTION

Figure 1:
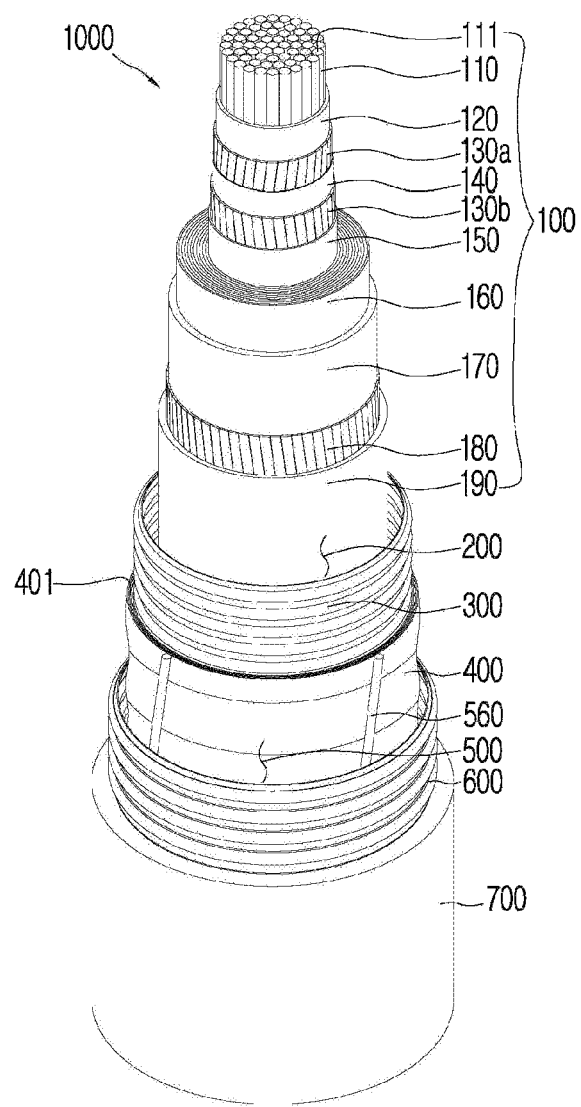
FIG. 1 is a perspective view illustrating a superconductive cable according to the present invention, the sheath of which is peeled off on a per unit basis.

Hereinafter, exemplary embodiments of the present invention will be described in detail with reference to the accompanying drawings. However, the present invention is not limited to the embodiments described herein, and may be embodied into other forms. The embodiments introduced herein are provided in order to allow the disclosed content to be exhaustive and complete and to allow the scope of the present invention to be sufficiently transferred to those skilled in the art. The same reference numerals will designate the same constituent elements throughout the specification.

Figure 2:
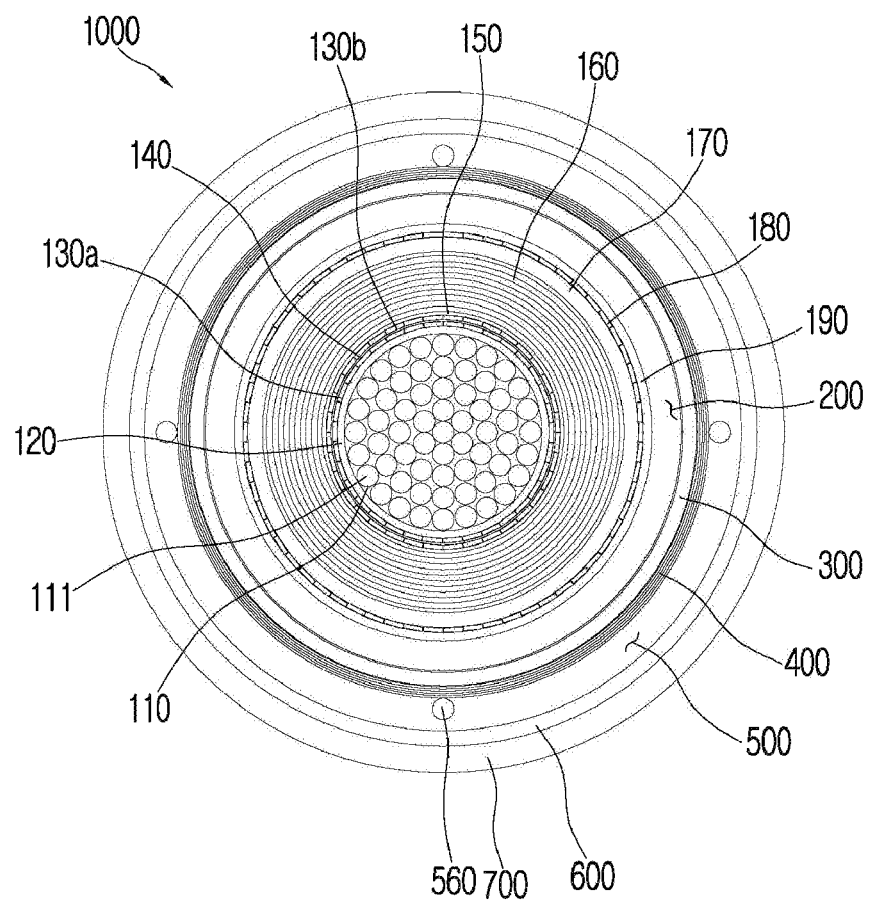
FIG. 2 is a cross-sectional view of the superconductive cable illustrated in FIG. 1.

FIG. 1 is a perspective view illustrating a superconductive cable according to the present invention, the sheath of which is peeled off on a per unit basis, and FIG. 2 is a cross-sectional view of the superconductive cable illustrated in FIG. 1.

The basic structure of the superconductive cable according to the present invention will be described below.

The superconductive cable may include a core unit 100, which includes a former 110, one or more superconductive conductor layers 130 each having multiple superconductive wire rods arranged parallel to each other in the longitudinal direction of the former 110 so as to surround the exterior of the former 110, an insulating layer 140 configured to surround the superconductive conductor layers 130, and one or more superconductive shield layers 180 having multiple superconductive wire rods arranged parallel to each other in the longitudinal direction of the former 110 so as to surround the exterior of the insulating layer 140. The superconductive cable may further include a cooling unit 200 provided outside the core unit 100 to cool the core unit 100, the cooling unit 200 having a refrigerant flow path of a liquid-phase refrigerant for cooling the core unit 100, an inner metal pipe 300 provided outside the cooling unit 200, a thermal insulation unit 400 provided outside the inner metal pipe 300 to form a thermal insulation layer by winding a thermal insulation material 401 in multiple layers, a vacuum unit 500 having multiple spacers 560 spaced apart from each other on the exterior of the thermal insulation unit 400 to realize vacuum thermal insulation of the cooling unit 200, an outer metal pipe 600 provided outside the vacuum unit 500, and a sheath unit 700 provided outside the outer pipe 600 to form a sheath layer. The average distance between the thermal insulation unit 400 and the outer metal pipe 600 may be greater than the diameter of the spacers 560 provided in the vacuum unit 500.

The respective constituent elements of the superconductive cable will be described below in sequence. The former 110 may serve as a frame that provides a place where the superconductive wire rods having a flat and elongated shape are mounted around the former 110 and defines the shape thereof, and may also serve as a path along which fault current flows. The former 110 may have a shape in which multiple copper (Cu) wires 111 having a circular cross section are circularly compressed.

Specifically, the former 110 basically has a circular cylindrical shape and serves as a frame that stands the flat and elongated superconductive wire rods. The diameter of the former 110 is determined in consideration of the width of the superconductive wire rods to cause the superconductive wire rods to have the structure closest to the circle when they stand around the former 110 while preventing the superconductive wire rods from being separated from each other.

As illustrated in FIGS. 1 and 2, although the former may include a solid central portion, the former 110 may have a hollow cylindrical shape so as to serve as a frame that stands the superconductive wire rods and to define a path for movement of a refrigerant therein. The respective wires 111 constituting the former may be formed of, for example, copper, and each wire may be connected parallel to a respective superconductive wire rod so that the former serves as a return conductor when faulty current is generated in an electric power system.

The cross-sectional area of the conductor, for example, copper wires, may be determined based on the capacity of faulty current. The copper wires may have a circularly compressed and stranded shape in consideration of a high-voltage application.

Since the multiple wires 111, which constitute the former 110 and each has a circular cross section, have a circularly compressed and stranded shape, the surface of the former 110 is inevitably uneven. Therefore, in order to smoothen the uneven surface of the former 110, a smoothing layer 120 may be applied to the exterior of the former 110. The smoothing layer 120 may be formed using, for example, semiconducting carbon paper or a brass tape.

Although not illustrated in the drawings, a cushion layer may be further provided between the smoothing layer 120 and the superconductive conductor layers 130. The cushion layer may be formed using semiconducting carbon paper or a semiconducting tape in order to protect the superconductive conductor layers.

Around the former 110, which is flattened by the smoothing layer 120, multiple superconductive wire rods 131 may be surrounded to form a first superconductive conductor layer 130a. The first superconductive conductor layer 130a may include the multiple superconductive wire rods closely arranged parallel to each other so as to surround the periphery of the smoothing layer 120.

In addition, as illustrated in FIG. 1, the superconductive conductor layers 130 may be formed in multiple layers according to the capacity of the current that is desired to be transmitted or distributed through the superconductive cable.

In the embodiment illustrated in FIG. 1, a total of two superconductive conductor layers 130a and 130b is provided. In addition, when the superconductive conductor layers are simply stacked one above another, the capacity of current is not increased due to the skin effect of current. In order to solve this problem, when superconductive conductor layers are formed in multiple layers, the insulating layer 140 may be interposed between the superconductive conductor layers 130a and 130b. The insulating layer 140 may be formed into an insulating tape, and may be interposed between the stacked superconductive conductor layers 130a and 130b so as to insulate the superconductive conductor layers 130a and 130b from each other, which may effectively prevent the skin effect in stacked superconductive wire rods. With the insulating layer 140, the superconductive conductor layers stacked in multiple layers may have the same electrical communication direction.

In the embodiment illustrated in FIG. 1, although the superconductive conductor layers 130 may include the first superconductive conductor layer 130a and the second superconductive conductor layer 130b by way of example, a greater number of superconductive conductor layers may be provided as needed.

In addition, the superconductive wire rods of each of the superconductive conductor layers 130a and 130b may be connected parallel to the respective wires of the former 110. This serves to allow current moved to the superconductive wire rods to move to the wires of the former 110 when an accident such as, for example, superconductivity destruction occurs. In this way, even when superconductivity is not satisfied, it is possible to prevent an increase in the resistance of the superconductive wire rods, and consequently, to prevent heat generation from or damage to the superconductive wire rods.

An inner semiconducting layer 150 may be provided on the exterior of the second superconductive conductor layer 130b, which is provided outside the first superconductive conductor layer 130a. The inner semiconducting layer 150 may serve to alleviate electric field concentration on a per area basis of the superconductive conductor layers 130 and to ensure a uniform surface electric field. Specifically, the inner semiconducting layer 150 may be provided to alleviate electric field concentration on the edge portion of the superconductive wire rod and to achieve uniform electric field distribution. This is equally applied to an outer semiconducting layer 170, which will be described later.

The inner semiconducting layer 150 may be formed by winding a semiconducting tape.

The insulating layer 160 may be provided outside the inner semiconducting layer 150. The insulating layer 160 may be provided to increase the insulation strength of the superconductive cable. Generally, although a Cross Linking Polyethylene (XLPE) or oil-filled cable is used for the insulation of a high-voltage cable, such a superconductive cable needs to be cooled to an extremely low temperature for the superconductivity of the superconductive wire rod. However, the XLPE cable may be damaged at extremely low temperatures, thus undergoing insulation destruction, and the oil-filled cable may cause, for example, environmental problems. Therefore, in the superconductive cable according to the present invention, the insulating layer 160 may be formed using insulating paper such as general paper, and may be configured by winding the insulating paper multiple times.

Kraft paper or polypropylene laminated paper (PPLP) is mainly used as the insulating paper. In the case of the superconductive cable, among various low-insulation materials, PPLP is used as the insulating paper in consideration of ease of winding and insulation strength.

The outer semiconducting layer 170 may be provided on the exterior of the insulating layer 160. The outer semiconducting layer may also be provided to alleviate electric field concentration on a per area basis of the superconductive conductor layers 130 and to ensure a uniform surface electric field. The outer semiconducting layer 170 may also be configured by winding a semiconducting tape.

In addition, the superconductive shield layers 180 may be provided outside the outer semiconducting layer 170. A method of forming the superconductive shield layers 180 may be the same as the method of forming the superconductive conductor layers 130. When the outer semiconducting layer 170 has an uneven surface, a smoothing layer (not illustrated) may be provided as needed. The superconductive wire rods, which constitute the superconductive shield layers 180, may be arranged parallel to each other in the circumferential direction on the exterior of the smoothing layer.

When current flowing in a shield layer formed of second-generation superconductive wire rods is designed to be about 95% of current flowing in a superconductive conductor layer, flux leakage may be minimized.

A core shell layer 190 may be provided outside the superconductive shield layers 180, and may serve as the outer shell of the core unit 100. The core shell layer 190 may include, for example, any of various tapes or binders. The core shell layer 190 may serve as an outer shell that allows the core unit 100 to be exposed to a cooling layer, which will be described later, and may also serve to bind all constituent elements of the core unit 100. The core shell layer 190 may be formed using a metal tape such as, for example, a SUS tape.

The core unit 100 of the superconductive cable may be configured by the above-described method. Although the smoothing layer and the semiconducting layer are illustrated in FIGS. 1 and 2 as being configured as a single layer formed of the same material, various layers may be added thereto as needed.

The cooling unit 200 may be provided outside the core unit 100. The cooling unit 200 may be provided to cool the superconductive wire rods of the core unit 100, and may include a circulation flow path of a liquid-phase refrigerant therein. The liquid-phase refrigerant may be liquid-phase nitrogen. The liquid-phase refrigerant (liquid-phase nitrogen) may circulate in the cooling flow path in the state in which it is cooled to a temperature of about −200 degrees Celsius, thereby maintaining an extremely low temperature, which is the superconductive condition of the superconductive wire rods included in the core unit inside the cooling unit.

The cooling flow path provided in the cooling unit 200 may allow the liquid-phase refrigerant to move in a given direction. The liquid-phase refrigerant, collected and re-cooled from, for example, a connection box of the superconductive cable, may be supplied to the cooling flow path of the cooling unit 200.

The inner metal pipe 300 may be provided outside the cooling unit 200. The inner metal pipe 300 serves, along with the outer metal pipe 600, as a sheath of the superconductive cable, in order to prevent mechanical damage to the core unit 100 during the routing and operation of the superconductive cable. Since the superconductive cable is wound on a drum so as to ensure easy fabrication and transport and is unwound from the drum upon installation, bending stress or tensile stress may be continuously applied to the superconductive cable.

The inner metal pipe 300 may be provided to ensure that the superconductive cable maintains initial performance even in the state in which mechanical stress is applied thereto. Thus, the inner metal pipe 300 has a corrugated structure in which ridges and valleys are repeated in the longitudinal direction of the superconductive cable in order to increase rigidity against mechanical stress. The inner metal pipe 300 may be formed of, for example, aluminum.

The inner metal pipe 300 may be at an extremely low temperature that corresponds to the temperature of the liquid-phase refrigerant because it is provided outside the cooling unit 200. Thus, the inner metal pipe 300 may be classified as a low-temperature metal pipe.

In addition, the thermal insulation unit 400 may be provided on the outer circumferential surface of the inner metal pipe 300, and may include a thermal insulation layer formed by winding a thermal insulation material in multiple layers. The thermal insulation material is formed by coating a metal film having high reflectance with polymers having low thermal conductivity in a thin layer form. The thermal insulation layer may configure a multi-layered insulation, and may be provided to prevent the introduction of heat to the inner metal pipe 300.

In particular, since the inner metal pipe 300 is formed of a metal material, and thus ensures easy heat introduction or heat exchange via conduction, the thermal insulation unit 400 may mainly minimize heat exchange or heat introduction via conduction, and may attain the effect of preventing heat exchange or heat introduction via radiation, owing to the metal film having high reflectance included therein.

The number of layers in the thermal insulation unit 400 may be adjusted in order to minimize heat introduction. A configuration adopting a great number of layers may increase a radiant heat shielding effect, but may deteriorate a conductive heat shielding effect as well as a convective heat shielding effect due to a reduction in the thickness of a vacuum layer. Therefore, it is important to use an appropriate number of layers.

The vacuum unit 500 may be provided outside the thermal insulation unit 400. The vacuum unit 500 may be provided to minimize heat transfer via, for example, convection, to the thermal insulation layer, which may occur when the thermal insulation by the thermal insulation unit 400 is not sufficient.

The vacuum unit 500 may be formed by defining a space outside the thermal insulation unit 400 and creating a vacuum in the space.

The vacuum unit 500 may include at least one spacer 560 for forming a physical space, which serves to prevent heat introduction via, for example, convection, from an exterior, which is at room-temperature, to the core unit. The at least one spacer 560 may be provided in the space in order to prevent, for example, the outer metal pipe 600 provided outside the space in the vacuum unit 500 from coming into contact with the thermal insulation unit 400 inside the vacuum unit 500.

The spacer 560 may be disposed in the longitudinal direction of the superconductive cable, and may be wound around the core unit 100, more specifically, the thermal insulation unit 400, in a spiral form or a circular form.

As illustrated in FIG. 1, multiple spacers 560 may be provided. The number of spacers 560 may be increased or reduced according to the type or size of the superconductive cable. In the superconductive cable according to the present invention, three to five spacers may be provided. The spacers may form the space for preventing heat exchange via conduction, and may be configured in a single layer or in multiple layers.

The spacers 560 may be formed of polyethylene (PE), fluorinated ethylene propylene (FEP), perfluoro alkoxy alkane (PFA), ethylene tetra fluoro ethylene (ETFE), poly (vinyl chloride) (PVC), or poly tetra fluoro ethylene (PTFE).

In addition, the spacers 560 may be formed of poly tetra fluoro ethylene (ETFE) as needed, or may be formed of a general resin or polyethylene and then be surface-coated with, for example, fluorinated polyethylene. In this case, the fluorinated polyethylene may be Teflon.

Teflon is one type of fluoride resin, and forms a highly stabilized compound via strong chemical bond of fluorine and carbon, thus exhibiting, for example, almost complete chemical inertness, heat-resistance and non-adhesion, good insulation stability, and a low frictional coefficient. In addition, since Teflon exhibits flexibility to some extent, the spacers 560 may be spirally wound around the thermal insulation unit 400 so as to be disposed in the longitudinal direction of the superconductive cable. Since Teflon also exhibits rigidity to some extent, the spacers 560 may prevent the contact between the thermal insulation unit 400 and the outer metal pipe 600 so as to physically define the space that configures the vacuum unit 500. The diameter of the spacers 560 may range from 4 mm to 8 mm. The spacers 560 may have any of various cross-sectional shapes such as, for example, a circular shape, a triangular shape, a rectangular shape, or a star shape.

The outer metal pipe 600 may be provided outside the vacuum unit 500 having the spacers 560. The outer metal pipe 600 may have the same shape and be made of the same material as the inner metal pipe 300. The outer metal pipe 600 may have a greater diameter than the inner metal pipe 300 so as to enable the formation of the space by the spacers 560. A detailed description related to the spacers 560 will follow.

In addition, the sheath unit 700 may be provided outside the outer metal pipe 600, and may serve as a sheath for protecting the inside of the superconductive cable. The sheath unit 700 may be formed of a sheath material for a sheath unit of a typical electric power cable. The sheath unit 700 may prevent corrosion of, for example, the metal pipe 600 therein and may prevent cable damage attributable to external force. The sheath unit 700 may be formed of, for example, polyethylene (PE) or poly(vinyl chloride) (PVC).

As illustrated in FIG. 2, four spacers 560 may be provided in the vacuum unit 500 so as to surround the thermal insulation unit 400, which is provided outside the inner metal pipe 300.

Figure 3:
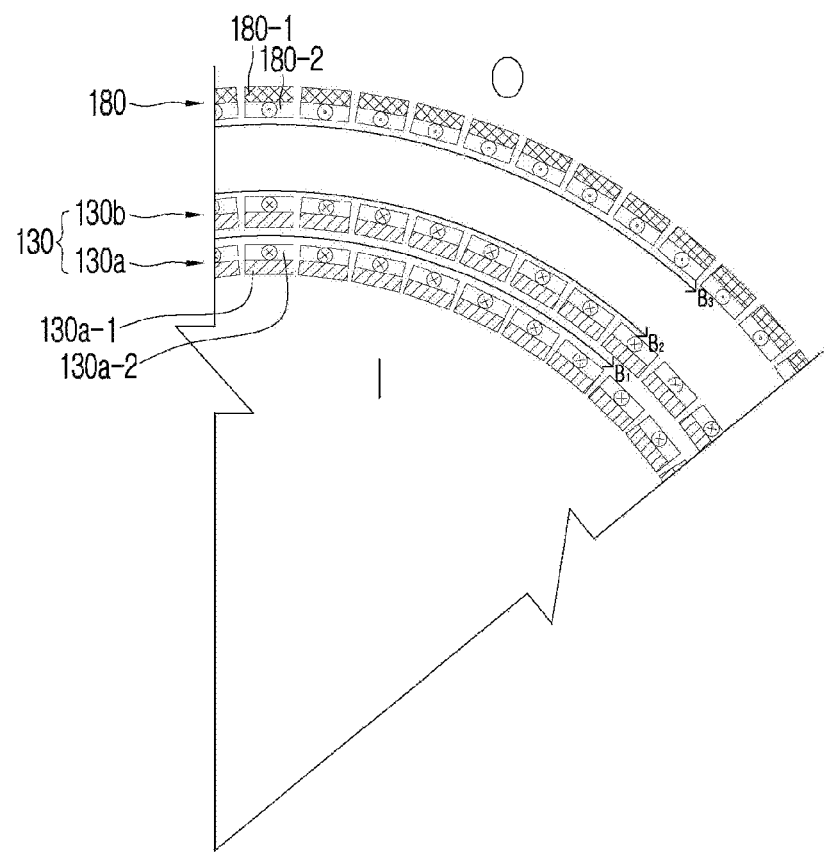
FIG. 3 is a conceptual view illustrating one embodiment of the superconductive cable according to the present invention.

FIG. 3 is a conceptual view illustrating one embodiment of the superconductive cable according to the present invention.

In the embodiment illustrated in FIG. 3, two superconductive conductor layers and one superconductive shield layer are provided by way of example.

The superconductive wire rods, which constitute the superconductive cable according to the present invention, are second-generation superconductive wire rods, and in the illustrated embodiment, a metal substrate thereof is formed of a nickel tungsten (Ni—W) alloy material.

The two superconductive conductor layers may include an inner first superconductive conductor layer and an outer second superconductive conductor layer.

For the convenience of illustration in the drawing, each superconductive wire rod is illustrated and described in a simplified form as including a metal substrate layer formed of a nickel alloy material such as, for example, nickel-tungsten (Ni—W), and multiple superconducting layers formed on the metal substrate layer using a superconductive material via, for example, deposition.

The superconductive wire rod, which constitutes the superconductive cable according to the present invention, may be a second-generation superconductive wire rod, and the superconductive material included in the superconducting layers of the superconductive wire rod may be mainly, for example, YBCO or REBCO (RE=Sm, Gd, Nd, Ny, Ho).

Specifically, a phenomenon in which electrical resistance becomes "zero" at a particular temperature or less is called a "superconductive phenomenon", and a high-temperature superconductor exhibits such a superconductive phenomenon at a higher temperature (about 100K, or −173 degrees Celsius) than absolute zero (−273 degrees Celsius). A superconductive wire rod used in an electric power cable field is formed of such a high-temperature superconductor. A first-generation wire rod having a main material of BSCCO and a second-generation coated conductor (CC) type wire rod having a main material of YBCO or REBCO have been introduced.

Recently, the second-generation superconductive wire rod has been used because the first-generation superconductive wire rod uses Ag as a basic material and thus makes it difficult to achieve a low cost and the second-generation superconductive wire rod has reduced alternating current loss and because the first-generation superconductive wire rod has a filament structure, but the second-generation superconductive wire rod has a layered structure and is more efficient in terms of hysteric loss.

Specifically, the second-generation superconductive wire rod may include, for example, a metal substrate layer, a buffer layer, a superconducting layer, and a protective layer. The metal substrate layer may be used as a base member of the wire rod, may serve to maintain the mechanical strength of the superconductive wire rod, and may be formed of, for example, Hastelloy or nickel-tungsten (Ni—W). The buffer layer may serve as a buffer for depositing the superconducting layer on the metal substrate layer. The superconducting layer may be used as a current communication path, and the protective layer may be configured as an alloy layer including silver (Ag) or copper (Cu). The silver (Ag) alloy layer may be located between the superconducting layer and the copper (Cu) alloy layer and may enable deposition, and the copper (Cu) alloy layer may serve to reinforce the mechanical strength thereof. The thickness and material of each alloy layer may be changed depending on the application thereof.

In addition, for convenience of description, the superconductive wire rod will be described below as being basically divided into the metal substrate layer and the superconducting layer. Thus, it may be understood that the buffer layer is provided between the metal substrate layer and the superconducting layer and the protective layer is provided outside the superconducting layer.

In addition, as mentioned above, the superconductive material included in the superconducting layer of the superconductive wire rod may be mainly, for example, YBCO or REBCO (RE=Sm, Gd, Nd, Dy, Ho).

In the embodiment illustrated in FIG. 3, metal substrate layers 130a-1 and 130b-1 of the first superconductive conductor layer 130a and the second superconductive conductor layer 130b are disposed toward the center of the superconductive cable, and superconducting layers 130a-2 and 130b-2 of the first superconductive conductor layer 130a and the second superconductive conductor layer 130b are disposed in the radial direction of the superconductive cable.

In addition, in the embodiment illustrated in FIG. 3, when current flows through the superconducting layer 130a-2 of the superconductive wire rod, which constitutes the first superconductive conductor layer 130a, and the superconducting layer 130b-2 of the superconductive wire rod, which constitutes the second superconductive conductor layer 130b, a circular magnetic field may be created by the current that flows through each superconducting layer 130a-2 or 130b-2 outside each of the first superconductive conductor layer 130a and the second superconductive conductor layer 130b.

The reason why each circular magnetic field is created outside a corresponding one of the first superconductive conductor layer 130a and the second superconductive conductor layer 130b is because the vertical components of the magnetic fields between the adjacent superconductive wire rods of the respective conductor layers are offset each other when the current flows in the same direction through the superconductive wire rods of the respective conductor layers.

Unlike the above-described superconductive conductor layers, a metal substrate layer 180-1 of the superconductive wire rod, which constitutes the superconductive shield layer 180, is disposed in the radial direction of the superconductive cable, and a superconducting layer 180-2 of the superconductive wire rod, which constitutes the superconductive shield layer 180, is disposed toward the center of the superconductive cable.

When current is applied to the superconducting layers 130a-2 and 130b-2 of the superconductive wire rods of the first superconductive conductor layer 130a and the second superconductive conductor layer 130b, in the superconducting layer 180-2 of the superconductive wire rod of the superconductive shield layer 180, current may flow in the direction opposite the direction of current in the superconducting layers 130a-2 and 130b-2 of the superconductive wire rods of the first superconductive conductor layer 130a and the second superconductive conductor layer 130b, and an induced magnetic field may be circularly internally created in the opposite way from the first superconductive conductor layer 130a and the second superconductive conductor layer 130b. The major magnetic fields at the boundary area and the inner and outer areas of the first superconductive conductor layer 130a, the second superconductive conductor layer 130b, and the superconductive shield layer 180 may be determined by the position of the superconducting layer of the superconductive wire rod, which constitutes the superconductive conductor layer or the superconductive shield layer.

That is, the magnitude of a magnetic field at a particular point may be determined based on whether or not the superconducting layer of the superconductive conductor layer or the superconductive shield layer is present at a close range and whether or not the superconducting layer and the metal substrate layer of the superconductive wire rod are magnetic substances.

This is because it may be assumed that only a small amount of the magnetic field that is generated when current flows to the superconducting layer of the superconductive wire rod of the superconductive conductor layer or the superconductive shield layer propagates to the other areas through the metal substrate layer that has ferromagnetism.

Therefore, when representing magnetic force lines by the induced magnetic field in a simplified form, the major magnetic fields at the boundary area and the inner and outer areas of the first superconductive conductor layer 130*a*, the second superconductive conductor layer 130*b*, and the superconductive shield layer 180 may be given B1, B2 and B3.

Since the respective magnetic fields B1, B2 and B3 are affected by the path of magnetic force lines caused by the metal substrate layer formed of a magnetic substance, the path of magnetic force lines by the magnetic field and the direction of the metal substrate layer of the superconductive wire rod of each superconductive conductor layer or the superconductive shield layer need to be determined in an appropriate manner.

For example, among the superconductive conductor layers of the embodiment illustrated in FIG. 3, when the metal substrate layer 130*b*-1 and the superconducting layer 130*b*-2 of the superconductive wire rod that constitutes the second superconductive conductor layer 130*b*, which is an outermost conductor layer, are disposed in opposite directions from the above description, that is, when the metal substrate layer 130*b*-1 of the superconductive wire rod of the second superconductive conductor layer 130*b* is disposed in the radial direction of the superconductive cable and the superconducting layer 130*b*-2 is disposed toward the center of the superconductive cable, the magnetic field B2, which is created by the second superconductive conductor layer 130*b* and surrounds the second superconductive conductor layer 130*b*, may be distorted or offset by ferromagnetism of the metal substrate layer 130*b*-1 close thereto, which may cause variation in the magnitude of the magnetic field. The distortion or offset of the magnetic field may entail the loss of alternating current that flows in an opposite direction.

A major magnetic field having a significant magnitude, among magnetic fields formed by a particular superconductive conductor layer, is formed in the circumferential direction at the boundary area with a superconducting layer of a superconductive wire rod that constitutes the corresponding superconductive conductor layer, rather than being close to a metal substrate layer of the superconductive wire rod. A magnetic field, formed at the opposite side across the metal substrate layer, may be offset by or may interfere with ferromagnetism of the metal substrate layer or a magnetic field formed by another superconductive conductor layer that is close to the corresponding superconductive conductor layer.

Variation in the magnetic force lines of the magnetic field may consequently reduce critical current or tolerance current of the superconductive conductor layer, thus causing alternating current loss. When current beyond the critical current is applied, various accidents or malfunctions may occur.

When three or more superconductive conductor layers are provided, an intermediate superconductive conductor layer is inevitably affected somewhat by magnetic fields formed by the others of the superconductive conductor layers stacked close to one another, even if the direction thereof is reversed. However, it may be assumed that, even if superconductive conductor layers are stacked in multiple layers, alternating current loss described above may be the worst when a superconducting layer of an outermost superconductive conductor layer is disposed toward the center of the superconductive cable in the opposite way from FIG. 3.

Accordingly, in the superconductive wire rod of the outermost superconductive conductor layer among the superconductive conductor layers, the metal substrate layer may be disposed toward the center of the superconductive cable and the superconducting layer may be disposed in the radial direction of the superconductive cable in order to minimize alternating current loss.

The superconductive shield layer 180, in which current flows in the direction opposite the direction of current in the superconductive conductor layer, needs to minimize the magnitude of an outwardly exposed magnetic field thereof. Accordingly, as illustrated in FIG. 3, the metal substrate layer 180-1 of the superconductive shield layer 180 may be disposed outward in the radial direction, which may minimize the magnitude of the magnetic field that is exposed outside the superconductive shield layer.

As can be appreciated from the embodiment illustrated in FIG. 3, the magnetic field formed by each superconductive conductor layer may surround the superconductive conductor layer, and the magnetic field formed by the induced current in the superconductive shield layer may be circularly formed inside the superconductive shield layer.

Accordingly, in the case of the superconductive shield layer 180, in the opposite way from the superconductive conductor layer, the metal substrate layer 180-1 of the superconductive wire rod that constitutes the superconductive shield layer 180 needs to be disposed in the radial direction, rather than being disposed toward the center, in order to minimize the magnitude of the magnetic field that is exposed outward and to minimize alternating current loss.

In conclusion, when each of the superconductive conductor layer and the superconductive shield layer is configured in multiple layers, in the two superconductive wire rods of an outermost one of the superconductive conductor layers and an innermost one of the superconductive shield layers, the metal substrate layers or the superconducting layers may be disposed in opposite directions. Specifically, as illustrated in FIG. 3, in superconductive wire rod of the outermost one of the superconductive conductor layers, the metal substrate layer may be disposed toward the center of the superconductive cable and the superconducting layer may be disposed in the radial direction of the superconductive cable, and in the superconductive wire rod of the superconductive shield layer, the metal substrate layer may be disposed in the radial direction of the superconductive cable and the superconducting layer may be disposed toward the center of the superconductive cable.

Figure 4:
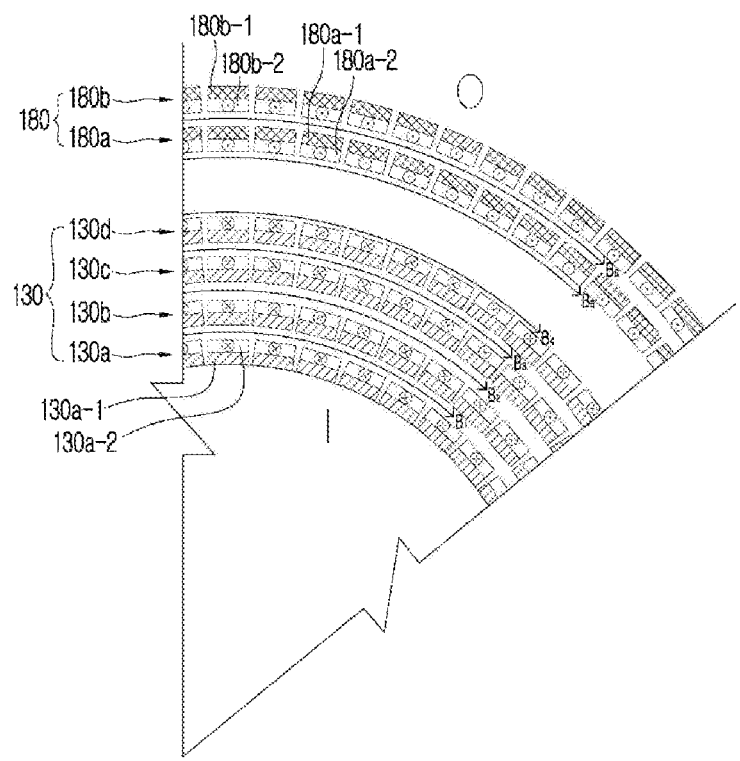
FIG. 4 is a conceptual view illustrating another embodiment of the superconductive cable according to the present invention.

FIG. 4 is a conceptual view illustrating another embodiment of the superconductive cable according to the present invention.

In the embodiment illustrated in FIG. 4, two superconductive conductor layers and one superconductive shield layer are provided by way of example. A repeated description thereof with reference to FIG. 3 will be omitted. Although the embodiment illustrated in FIG. 3 is the same as the embodiment illustrated in FIG. 3 in that the superconductive conductor layers are configured in multiple layers, there is a difference in that four superconductive conductor layers are provided in order to increase electric power transmission capacity.

In addition, the number of superconductive shield layers is increased to two in proportion to an increase in the number of superconductive conductor layers.

As can be appreciated from the above description, when the positions of a metal substrate layer 180a-1 and a superconducting layer 180a-2 of a superconductive wire rod that constitutes a first superconductive shield layer 180a, which is an innermost one of the two superconductive shield layers 180a and 180b, are changed, the magnetic field created by the first superconductive shield layer 180a may be affected by the metal substrate layer 180a-1 of the superconductive wire rod of the first superconductive shield layer 180a such that the vertical component is reinforced in a portion of the horizontal magnetic field. Therefore, in the same manner as the superconductive conductor layer, alternating current loss related to induced current may be increased, causing deterioration in shielding capability.

Accordingly, assuming that both the superconductive conductor layer and the superconductive shield layer are configured in multiple layers, when a metal substrate layer of a superconductive wire rod of an outermost superconductive conductor layer is disposed toward the center of the superconductive cable and a superconducting layer of a superconductive wire rod of an innermost superconductive shield layer is disposed toward the center of the superconductive cable, alternating current loss by the magnetic fields formed by the outermost superconductive conductor layer and the innermost superconductive shield layer may be minimized.

In addition, it was found via experimentation that alternating current loss is minimized when the directions of a metal substrate layer and a superconducting layer of each of multiple superconductive conductor layers and multiple superconductive shield layers correspond to those in an outermost superconductive conductor layer and an innermost superconductive shield layer.

Accordingly, the multiple superconductive conductor layers 130 or the multiple superconductive shield layers 180 may be stacked such that the metal substrate layers or the superconducting layers thereof are disposed in the same direction.

In conclusion, in the two superconductive wire rods of an outermost one of the superconductive conductor layers and an innermost one of the superconductive shield layers, the metal substrate layers or the superconducting layers are disposed in opposite directions. More specifically, in the superconductive wire rods of the superconductive conductor layers, the metal substrate layers are disposed toward the center of the superconductive cable and the superconducting layers are disposed in the radial direction of the superconductive cable. As illustrated in FIG. 4, when each of the superconductive conductor layer and the superconductive shield layer is configured in multiple layers, in the superconductive wire rods of the superconductive conductor layers, all of the metal substrate layers may be disposed toward the center of the superconductive cable and all of the superconducting layers may be disposed in the radial direction of the superconductive cable, and in the superconductive wire rods of the superconductive shield layers, all of the superconducting layers may be disposed toward the center of the superconductive cable and all of the metal substrate layers may be disposed in the radial direction of the superconductive cable, in order to minimize alternating current loss.

Figure 5:
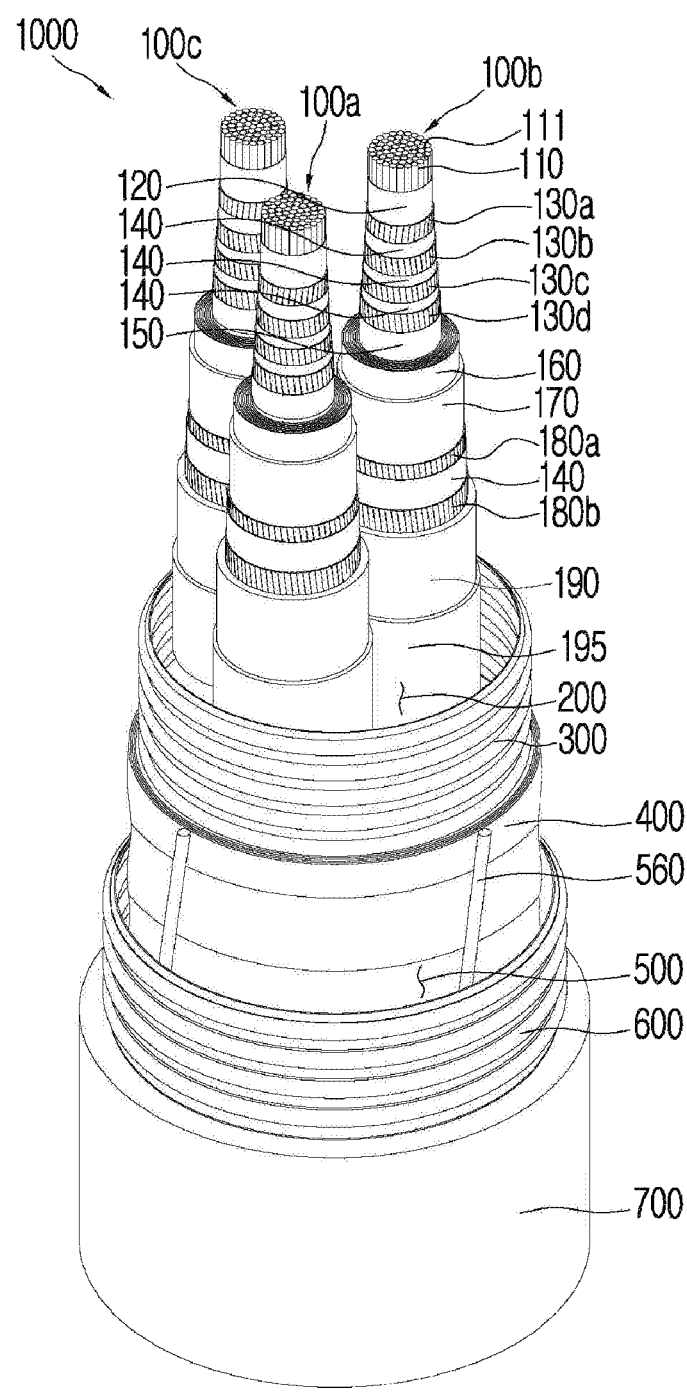
FIG. 5 is a view illustrating a further embodiment of the superconductive cable according to the present invention.
Figure 6:
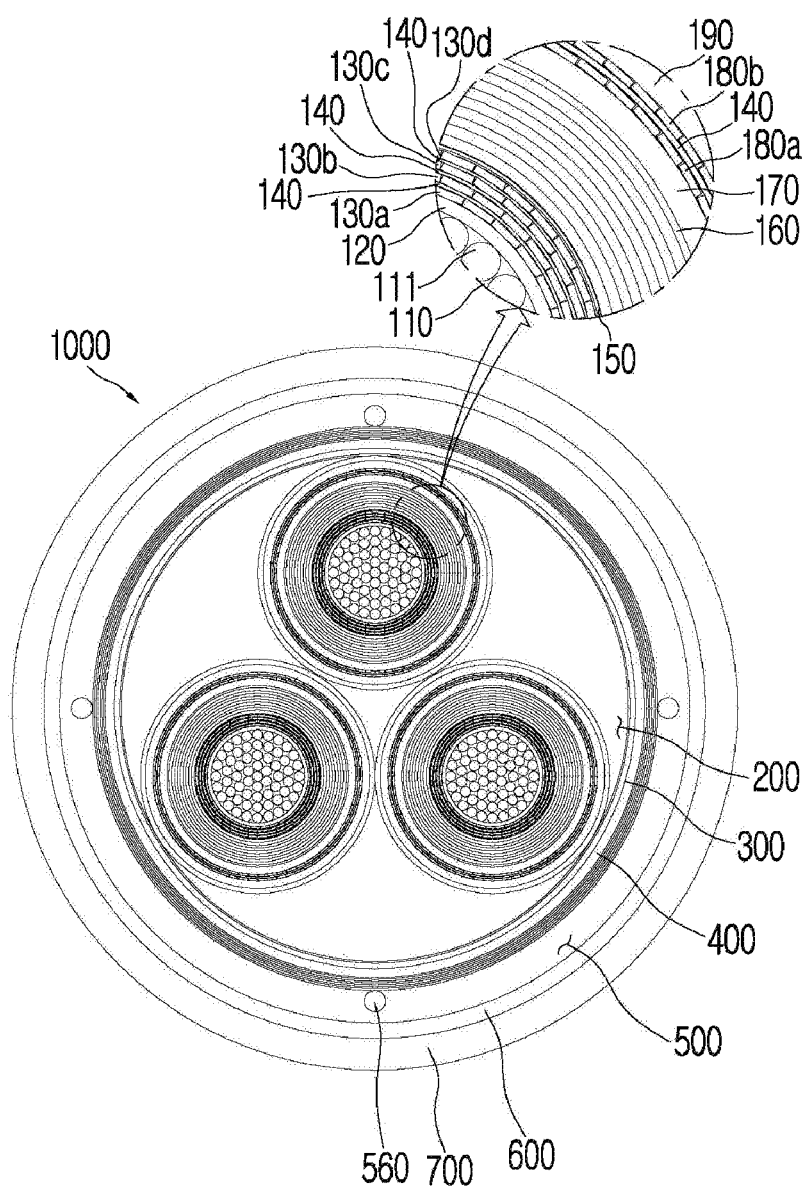
FIG. 6 is a cross-sectional view illustrating the horizontally installed state of the superconductive cable illustrated in FIG. 5.

FIG. 5 is a perspective view illustrating a further embodiment of the superconductive cable according to the present invention, and FIG. 6 is a cross-sectional view illustrating the horizontally installed state of the superconductive cable illustrated in FIG. 5. A repeated description of the description with reference to FIGS. 1 to 4 will be omitted. The embodiment illustrated in FIGS. 5 and 6 exemplifies a three-phase superconductive cable in which the number of core units 100 provided in the superconductive cable is 3 or more.

In addition, unlike the embodiment illustrated in FIGS. 1 and 2, the description of FIG. 4 in which four superconductive conductor layers and two superconductive shield layers are provided for each core unit may be applied to the embodiment illustrated in FIGS. 5 and 6.

Accordingly, in the embodiment illustrated in FIGS. 5 and 6, assuming that both the superconductive conductor layer and the superconductive shield layer are configured in multiple layers, as described above with reference to FIG. 4, when a metal substrate layer of an outermost superconductive conductor layer 130d among the superconductive conductor layers 130 is disposed toward the center of the superconductive cable and a superconducting layer of a superconductive wire rod of an innermost superconductive shield layer among the superconductive shield layers is disposed outward in the radial direction of the superconductive cable, alternating current loss due to the magnetic fields formed by the outermost superconductive conductor layer and the innermost superconductive shield layer may be minimized.

Accordingly, each of the multiple superconductive conductor layers 130 and the multiple superconductive shield layers 180 may be stacked such that the metal substrate layers or the superconducting layers thereof are disposed in the same direction.

The three-phase superconductive cable may be configured such that the three core units 100 share one cooling unit 200, rather than being configured such that each core unit 100 independently includes the cooling unit 200, and may also share one vacuum unit 500 provided outside the cooling unit 200.

Although the exemplary embodiments of the present invention have been described above in detail, the present invention may be modified and altered in various ways by those skilled in the art within the scope and range of the present invention described in the following claims. Hence, it should be understood that the modifications are included in the technical scope of the present invention so long as they basically include constituent elements of the claims of the present invention.

The invention claimed is:

1. A superconductive cable comprising:
   a core unit including a former, one or more superconductive conductor layers each having a plurality of superconductive wire rods arranged parallel to each other in a longitudinal direction of the former so as to surround an exterior of the former, an insulating layer configured to surround the superconductive conductor layers, and one or more superconductive shield layers each having a plurality of superconductive wire rods arranged parallel to each other in the longitudinal direction of the former so as to surround an exterior of the insulating layer;
   a cooling unit provided outside the core unit, the cooling unit having a circulation flow path of a liquid-phase refrigerant for cooling the core unit;

a thermal insulation unit provided outside the cooling unit, the thermal insulation unit being configured by winding a thermal insulation material multiple times; and a vacuum unit provided outside the thermal insulation unit, the vacuum unit having a plurality of spacers spaced apart from one another, wherein each of the superconductive wire rods of the superconductive conductor layers and the superconductive shield layers includes a metal substrate layer and a plurality of superconducting layers deposited on the metal substrate layer using a superconductive material, wherein, in each superconductive wire rod of an outermost superconductive conductor layer among the superconductive conductor layers, the metal substrate layer is disposed toward a center of the superconductive cable and the superconducting layers are disposed in a radial direction of the superconductive cable, and wherein, in each superconductive wire rod of an innermost superconductive shield layer among the superconductive shield layers, the superconducting layers are disposed toward the center of the superconductive cable and the metal substrate layer is disposed in the radial direction of the superconductive cable.

2. The superconductive cable according to claim 1, wherein the superconductive conductor layers are configured in multiple layers, and in the superconductive wire rods of the superconductive conductor layers, the metal substrate layers are disposed toward the center of the superconductive cable and the superconducting layers are disposed in the radial direction of the superconductive cable.

3. The superconductive cable according to claim 2, wherein the superconductive conductor layers are configured in four layers, and the superconductive shield layers are configured in two layers.

4. The superconductive cable according to claim 1, wherein the superconductive shield layers are configured in multiple layers, and in the superconductive wire rods of the superconductive shield layers, all of the superconducting layers are disposed toward the center of the superconductive cable and all of the metal substrate layers are disposed in the radial direction of the superconductive cable.

5. The superconductive cable according to claim 1, wherein the superconductive wire rods of the superconductive conductor layers and the superconductive shield layers are second-generation superconductive wire rods including a metal substrate layer formed of a nickel alloy material.

* * * * *